(12) United States Patent
Palacios Laloy

(10) Patent No.: US 10,845,438 B2
(45) Date of Patent: Nov. 24, 2020

(54) VECTOR MAGNETOMETER WITH ELLIPTICAL POLARISATION

(71) Applicant: COMMISSARIAT A L'ENERGIE ATOMIQUE ET AUX ENERGIES ALTERNATIVES, Paris (FR)

(72) Inventor: Agustin Palacios Laloy, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 0 days.

(21) Appl. No.: 16/272,103

(22) Filed: Feb. 11, 2019

(65) Prior Publication Data

US 2019/0250223 A1 Aug. 15, 2019

(30) Foreign Application Priority Data

Feb. 12, 2018 (FR) ...................................... 18 51170

(51) Int. Cl.
| G01V 3/00 | (2006.01) |
|---|---|
| G01R 33/26 | (2006.01) |
| G01R 33/44 | (2006.01) |
| G01R 33/032 | (2006.01) |

(52) U.S. Cl.
CPC ........... *G01R 33/26* (2013.01); *G01R 33/032* (2013.01); *G01R 33/443* (2013.01)

(58) Field of Classification Search
USPC ....................................................... 324/305
See application file for complete search history.

(56) References Cited

U.S. PATENT DOCUMENTS

| 3,197,694 A * | 7/1965 | Cunningham | G01R 33/26 324/304 |
|---|---|---|---|
| 3,725,775 A * | 4/1973 | Gasser | G01R 33/26 324/301 |
| 5,225,778 A * | 7/1993 | Chaillout | G01R 33/26 324/304 |

(Continued)

FOREIGN PATENT DOCUMENTS

EP 0462011 A1 12/1991

OTHER PUBLICATIONS

French Search Report application No. 1851170 dated Dec. 5, 2019.
(Continued)

*Primary Examiner* — Rodney E Fuller
(74) *Attorney, Agent, or Firm* — Pearne & Gordon LLP

(57) ABSTRACT

A vector magnetometer comprising a cell filled with an atomic gas subjected to an ambient magnetic field, an optical pumping source capable of emitting a pump beam tuned to a pumping wavelength towards the cell and a parametric resonance detection device receiving a probe beam that has passed through the cell, the probe beam being identical to or different from the pump beam. The magnetometer also comprises a polarisation device configured so as to simultaneously or alternately confer linear polarisation and circular polarisation to the pump beam emitted towards the cell. And the detection device comprises an optical set up configured to separate, from the probe beam that has passed through the cell, optical signals carrying respectively information about an alignment state of the atoms from information about an orientation state of the atoms.

12 Claims, 3 Drawing Sheets

(56) References Cited

U.S. PATENT DOCUMENTS

| | | | | |
|---|---|---|---|---|
| 5,254,947 | A * | 10/1993 | Chaillout | G01R 33/26 324/304 |
| 5,272,436 | A * | 12/1993 | Chaillout | G01R 33/26 324/304 |
| 8,212,556 | B1 * | 7/2012 | Schwindt | G01R 33/26 324/301 |
| 9,964,609 | B2 * | 5/2018 | Ichihara | G01R 33/26 |
| 2008/0106261 | A1 | 5/2008 | Romalis et al. | |
| 2010/0156419 | A1 | 6/2010 | Sugioka | |
| 2010/0188081 | A1 | 7/2010 | Lammegger | |
| 2013/0278253 | A1 * | 10/2013 | Ichihara | G01R 33/26 324/304 |
| 2015/0022200 | A1 * | 1/2015 | Ichihara | G01R 33/26 324/304 |
| 2016/0116553 | A1 | 4/2016 | Kim et al. | |
| 2018/0164102 | A1 | 6/2018 | Morales et al. | |
| 2019/0003833 | A1 | 1/2019 | Palacios Laloy | |
| 2019/0074660 | A1 * | 3/2019 | Beato | H01S 5/0687 |
| 2020/0018802 | A1 * | 1/2020 | Palacios Laloy | G01R 33/032 |

OTHER PUBLICATIONS

Budker, D. et al. "Resonant nonlinear magneto-optical effects in atoms" In: Rev. Mod. Phys. Nov. 2002, vol. 74, No. 4, pp. 1153-1201.

Dupont-Roc, J. "Determination par des méthodes optiques des trois composantes d'un champ magnétique très faible" In: Revue de Physique Appliquee, 1970, vol. 5, No. 6, pp. 853-864.

Morales, S. et al. "Magnetocardiography measurements with 4He vector optically pumped magnetometers at room temperature" In: Physics in Medicine and Biology. 2017.

Laloë, F. et al. "Relations entre l'état angulaire d'une vapeur atomique soumise au pomage optique et ses propriétés 'absorption et de dispersion" In: Journal de Physique, 1969, vol. 30, No. 2-3, pp. 277-288.

U.S. Appl. No. 16/089,688 titled "Device for Measuring Rotation, Associated Method and Inertial Navigation Unit", filed Sep. 28, 2018.

* cited by examiner

VECTOR MAGNETOMETER WITH ELLIPTICAL POLARISATION

TECHNICAL FIELD

The field of the invention is optical pumping and parametric resonance magnetometers slaved in zero-field.

STATE OF PRIOR ART

Optical pumping magnetometers use atomic gases confined in a cell, typical metastable helium or alkaline gases, as sensitive elements. These magnetometers that can be in different configurations, can be used to determine the magnetic field by making use of the following three processes that take place either sequentially or concomitantly:
1) The use of polarised light sources, typically lasers, provides a means of preparing atomic states characterised by a given orientation or alignment of their spins. This method is called "optical pumping" in the field.
2) These atomic states change under the effect of the magnetic field, particularly under the Zeeman effect that corresponds to offsets of energy levels as a function of the magnetic field applied to the atoms.
3) The optical properties of the atomic medium are then changed depending on the state of the atoms. Thus an optical measurement can be made, for example an optical absorption measurement, to determine the effective Zeeman offset and use it to deduce a measurement of the magnetic field in which the cell is immersed.

Depending on the different possible configurations of existing optical pumping magnetometers, a distinction is made between a measurement of the modulus, also called the norm, of the magnetic field for scalar magnetometers, or a determination of the different components of the magnetic field for vector magnetometers, at the location of the cell.

The sensitivity level, also called low noise, and the accuracy that can be achieved with such optical pumping magnetometers are very remarkable and significantly better that what is possible with other magnetic measurement technologies (fluxgate, Hall effect, magnetoresistance, etc.). The only magnetometer that has similar noise is the SQUID type magnetometer, but it requires cryogenic cooling of the sensitive element and contains elements that have to be superconducting for its operation, which restricts its use in practice.

There are two well-known configurations for making a vector measurement of the magnetic field with a wide passband; the first is called the "Hanle effect" configuration and the second is called the "parametric resonance magnetometer". These configurations are described particularly in the paper by J. Dupont-Roc, "Détermination par des méthodes optiques des trois composantes d'un champ magnétique très faible" (Determination of the three components of a very weak magnetic field by optical methods) Revue de Physique Appliquée, vol. 5, No. 6, pp. 853-864, 1970. They function at very low values of the external magnetic field, inducing a Zeeman offset which is weaker than relaxation rates of Zeeman sub-levels of the atom, which for the case of helium fixes a limit of about 100 to 150 nano Tesla, which is 500 times less intense than the earth's magnetic field.

When a weak static transverse magnetic field sweeping around zero is applied to the cell, the atoms are affected by a precession movement and the number of absorbed photons, coming from the optical pumping laser is subject to resonant variations (Hanle effect). Comparable resonances, called parametric resonances, in the presence of frequency modulated magnetic fields, are observed when a radio frequency field is applied. Under these conditions, the magnetic moment of each atom is affected by resonant oscillations at frequencies that are multiples of the frequency of the radio frequency field. A measurement of the amplitude of these oscillations can be used to determine the modulus of the component of the magnetic field colinear with the radio frequency field.

In both of these two configurations, it is advantageous to make the magnetometer function "in closed loop" by continuously applying a zero total magnetic field to the sensitive element. This functioning, called zero-field slaving, has the advantage of being less sensitive to the variation of experimental parameters (laser powers, density of the sensitive element, etc.).

The zero total magnetic field is obtained by generating magnetic compensation fields by the injection of currents into appropriate coils that surround the sensitive element. These compensation fields cancel each of the components of the ambient magnetic field making use of closed loop regulation of injected currents. The measurement of currents circulating in the coils makes it possible to deduce the fields that have to be applied to cancel the different components of the ambient field, and therefore to obtain the value of these different components.

Thus, the parametric resonance magnetometer can be used to deduce the three components of the ambient magnetic field independently, thus making a vector measurement possible. The two components parallel to the application axis of two radio frequency fields are thus obtained by measuring the amplitude of the demodulated photodetection signal at the oscillation frequency of and in quadrature with the corresponding radio frequency field. This amplitude is directly proportional to the magnetic field parallel to the axis of the corresponding radio frequency field. It is also possible to obtain the third component of the magnetic field (perpendicular to the two RF fields) since the first inter-harmonic of the two oscillation frequencies of the radio frequency fields is proportional to its amplitude. However, proportionality factors for measuring this third axis are not as good as the first two. Thus, noise that accompanies the measurement of the field along this third axis is typically at least one order of magnitude higher than noise associated with the other two axes. This noise level can be problematic in magnetometer applications in which the magnetic field measurement is used to deduce the position of field sources (currents or magnetic materials), this excess noise inducing large uncertainties on the magnitudes or positions of these sources.

PRESENTATION OF THE INVENTION

The purpose of the invention is to compensate for this excess noise affecting the measurement on the third magnetometer axis to reduce uncertainty on the vector measurement of the magnetic field. To achieve this, the invention discloses a parametric resonance vector magnetometer comprising:
   a cell is to be filled with an atomic gas subjected to an ambient magnetic field,
   an optical pumping source arranged to emit a pump beam with a pumping wavelength towards the cell,
   a parametric resonance detection device arranged to receive a probe beam that has passed through the cell, the probe beam being the pump beam or a beam distinct from the pump beam.

The vector magnetometer also comprises a polarisation device configured so as to confer a linear polarisation and a circular polarisation to the pump beam emitted towards the cell and thus to place the atomic gas atoms in both an aligned and oriented state. The detection device comprises an optical arranged to separate, from the probe beam that has passed through the cell, optical signals carrying respectively information about an alignment state and information orientation state of the atoms of the atomic.

Some preferred but non-limitative aspects of this magnetometer are as follows:
- it comprises a parametric resonance excitation source configured such that it induces a radio frequency excitation field with three components in the cell, each of the components of the radio frequency field oscillating at its own oscillation frequency, and the detection device is configured to make a synchronous detection with a harmonic of each oscillation frequency;
- the detection device is configured to measure the amplitude of the optical signal carrying information about the orientation state of the atoms of the atomic gas at a harmonic of the oscillation frequency of each of the components of the radio frequency excitation field orthogonal to the propagation direction of the pump beam, and to measure the amplitude of the optical signal carrying information about the alignment state of the atoms of the atomic gas at a harmonic of the oscillation frequency of each of the components of the radio frequency excitation field orthogonal to the direction of the electric field of the pump beam;
- the optical arrangement comprises a divider of the probe beam that passed through the cell into a first channel and a second channel, an alignment state analyser on the first channel and a circular orientation state analyser on the second channel;
- the alignment state analyser comprises a linear polariser and a photodetector;
- the orientation state analyser comprises a circular polariser and a photodetector;
- the alignment state analyser comprises a quarter wave plate, a polarisation separator capable to separate the right circular polarisation and the left circular polarisation of the probe beam on a first and a second path, and a photodetector on each of the first and second paths;
- the orientation state analyser comprises a polarisation separator capable to separate the horizontal linear polarisation and the vertical linear polarisation of the probe beam on a first and a second path, and a photodetector on each of the first and second paths;
- the optical arrangement comprises a temporal separator of the probe beam that passed through the cell alternately into a circularly polarised beam and a linearly polarised beam, and an atomic state analyser downstream from the separator;
- the polarisation device is configured so as to simultaneously confer the linear polarisation and the circular polarisation to the pump beam emitted towards the cell;
- the polarisation device is configured so as to alternately confer the linear polarisation and then the circular polarisation to the pump beam emitted towards the cell;

The invention also relates to a method of measuring a magnetic field using a parametric resonance vector magnetometer comprising a cell filled with an atomic gas subjected to an ambient magnetic field, an optical pumping source capable of emitting a pump beam tuned to a pumping wavelength towards the cell, a parametric resonance detection device receiving a probe beam that has passed through the cell and a closed loop slaving system of the magnetometer to make it operate in zero field. This method includes steps consisting of linearly and circularly polarising the pump beam emitted towards the cell, and to use an optical arrangement in the detection device to separate optical signals carrying respectively information about an alignment state and information about an orientation state, of the atoms of the atomic gas.

Some preferred but non-limitative aspects of this method are as follows:
- it comprises use of a parametric resonance excitation source to generate a radio frequency excitation field with three components in the cell, each of the components of the radio frequency field oscillating at its own oscillation frequency, and synchronous detection with a harmonic of each oscillation frequency;
- it comprises a measurement of the amplitude of the optical signal carrying information about the orientation state of the atoms of the atomic gas at a harmonic of the oscillation frequency of each of the components of the radio frequency excitation field orthogonal to the propagation direction of the pump beam, and a measurement of the amplitude of the optical signal carrying information about the alignment state of the atoms of the atomic gas at a harmonic of the oscillation frequency of each of the components of the radio frequency excitation field orthogonal to the direction of the electric field of the pump beam;
- it comprises a division of a probe beam that passed through the cell into a first channel and a second channel, an analysis of the alignment state on the first channel and an analysis of the orientation state on the second channel;
- it comprises a temporal separation of the probe beam that passed through the cell alternately into a circular polarised beam and in a linearly polarised beam, and an atomic state analysis made after from said separation;
- the pump beam emitted towards the cell is simultaneously linearly and circularly polarised;
- the pump beam emitted towards the cell is alternately linearly and then circularly polarised.

BRIEF DESCRIPTION OF THE DRAWINGS

Other aspects, purposes, advantages and characteristics of the invention will be better understood after reading the detailed description given below of preferred embodiments of the invention, given as non-limitative examples, with reference to the appended drawings on which.

DETAILED PRESENTATION OF PARTICULAR EMBODIMENTS

Figure 1:
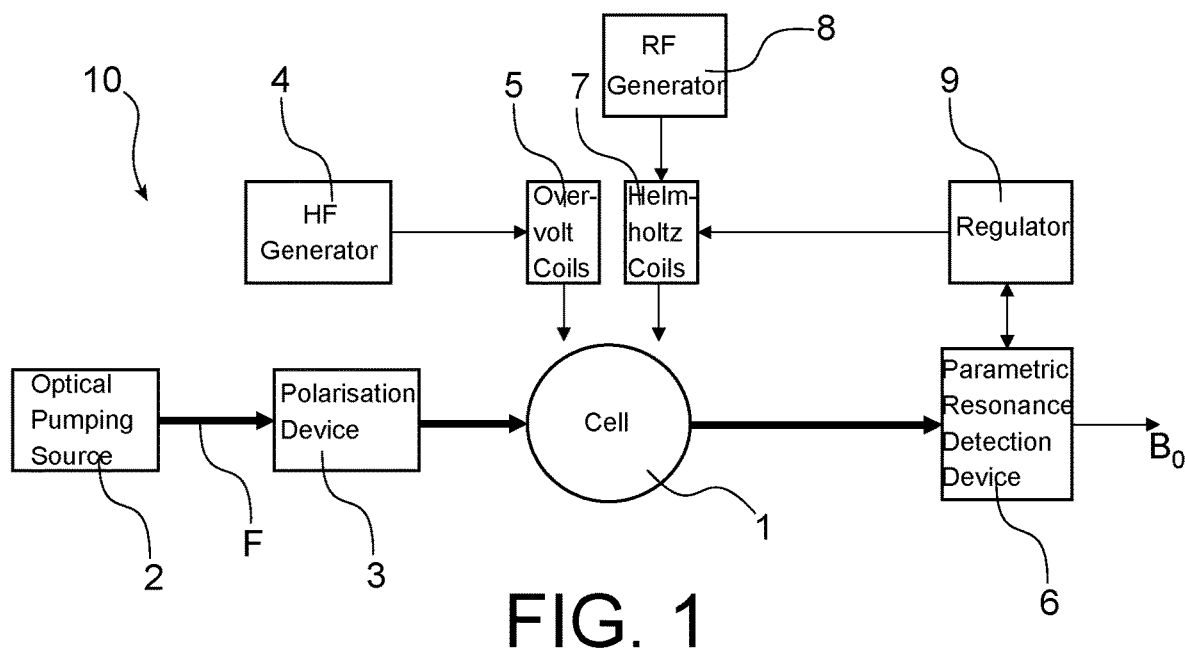
FIG. 1 is a diagram of a magnetometer according to the invention.

With reference to FIG. 1, the invention relates to an optically pumped vector magnetometer 10 that comprises a cell 1 filled with an atomic gas, for example helium-4 or an alkali gas subjected to an ambient magnetic field $B_0$, the projection of which onto three coordinate axes defines three components. The ambient magnetic field $B_0$ is thus broken down into three components Bx, By and Bz, each along one of the measurement axes x, y and z of the magnetometer.

The cell is illuminated by an optical pumping source 2 capable of emitting a light beam F, for example a laser beam, towards the cell 1, tuned to a pumping wavelength (this beam is this also called the pump beam). The pumping wavelength is fixed on an atomic transition line, for example on the $D_0$ line at 1083 nm in the case of helium-4. The light beam is polarised by means of a polarisation device 3 intercalated between the optical pumping source and the cell or directly integrated into the optical pumping source.

In the case in which the sensitive element is helium-4, the magnetometer 10 also comprises a high frequency (HF) discharge system comprising an HF generator 4 and over-voltage coils 5, to bring the atoms of atomic gas into an energised state in which they are capable of being subjected to an atomic transition when they are illuminated by the laser beam, typically in the metastable state $2^3S_1$.

The magnetometer also comprises a parametric resonance excitation circuit that comprises a radio frequency generator 8 that outputs to Helmholtz coils 7 with orthogonal axes that surround the cell so as to generate a parametric resonance magnetic excitation field, also called a radio frequency excitation field. The magnetometer also comprises a parametric resonance detection device 6 that receives a light beam that has passed through the cell (i.e. a probe beam that may be the pump beam or a beam distinct from the pump beam).

The magnetometer may also comprise a closed loop slaving system of the magnetometer so that a zero total magnetic field is continuously applied to the sensitive element. The slaving system comprises a regulator 9 coupled to the detection device 6 and that injects a current into the Helmholtz coils 7 so as to generate a magnetic compensation field Bc such that the sum $Bc+B_0$ is kept equal to zero at all times.

Alternatively, the magnetometer can be operated in open loop, without compensation of the ambient field.

It is usual to pump with circularly polarised light, which induces so-called "oriented" atomic states that are characterised by the fact that the average value of their magnetic spin moment is not equal to zero in the direction corresponding to propagation of the pump beam. For example, if this direction corresponds to the z axis, the average value of the magnetic spin moment spin Sz will not be zero.

Pumping can also be done using linearly polarised light which induces "aligned" atomic states characterised by the fact that the average value of a second order observable on the magnetic spin moment is not equal to zero. For example, an aligned state along the z axis is characterised by the fact that the observable $3S_z^2 - \vec{S}^2$ is not equal to zero. The alignment axis is then fixed by the direction of the electric field of light used for pumping, light with an electric field parallel to z creating an alignment along z.

The invention discloses that pumping can be done differently by adopting as polarisation device 3 a device configured to confer linear polarisation and circular polarisation onto the pump beam emitted towards the cell. In particular, this device 3 is configured to confer to the atoms of the atomic gas in the cell a state with both aligned and oriented The polarisation device 3 can be configured so as to simultaneously confer the linear polarisation and the circular polarisation, the pump beam emitted towards the cell then being elliptically polarised Such a device 3 may comprise a linear polariser and a quarter wave plate for which the neutral axes are rotated at an angle not equal to 45° relative to the axes of the linear polariser, for example 22.5°.

The effect of such elliptical polarisation is to prepare atomic states along an orientation and an alignment resulting in both linear polarisation and circular polarisation. Thus, the state acquired by atoms of atomic gas in the cell is both aligned and oriented, in proportion to the degree of ellipticity of the polarisation. The state of atoms is broken down more particularly into an orientation along the propagation of the pump beam and an alignment oriented principally along the linear polarisation axis of the pump beam (with a weak component longitudinal to the propagation of light resulting from a residual term originating from pumping in circular polarisation).

Alternatively, the polarisation device 3 may be configured to alternately confer a linear polarisation and then the circular polarisation. Such a polariser 3 may include a linear polariser and an electrically controllable delay plate. This plate can be modulated with a square wave such that during half-periods in which its output level is high (denoted SH), it behaves like a quarter wave plate, while during low level half periods (denoted SL), it behaves like a plate with no delay or a half-wave plate. Thus, during the SH half-periods, the pump beam emitted towards the cell is circularly polarised and atomic states in the cell are oriented. During the SH half-periods, the pump beam emitted towards the cell is linearly polarised and atomic states in the cell are oriented. Since the dynamic of atoms is dominated by a relaxation time if the order of 1 ms, of the SL/SH modulation is faster (which is the case in the example mentioned below), the atoms are placed in a superposition of aligned and oriented states. Therefore it is not the case of a successive passage through these two states, but rather concomitance of the two properties.

It will be noted that in order to limit the impact of non-linear magneto-optic effects, the light power of the pump beam is preferably limited so that it is typically less than or is of the same order as the saturation intensity. These effects, for example described in the paper by D. Budker et al. "Resonant nonlinear magneto-optical effects in atoms," Rev. Mod. Phys., vol. 74, No. 4, pp. 1153-1201, November 2002, can in fact induce coupling between changes to the orientation and alignment components that in particular make changes to the state of atoms more complex and jeopardise correct operation of the invention.

In the framework of the invention, a pair of coils 7 is provided on each of the magnetometer axes so as to generate a radio frequency excitation field with three orthogonal components. The parametric resonance excitation source is more particularly controlled so that it induces a radio frequency excitation field in the cell with three components, each of these components oscillating at its own oscillation frequency. There is thus an RFx component, an RFy component and an RFz component on the x, y and z axes with angular frequencies $\xi$, $\Omega$ and $\omega$ respectively.

Under these conditions, the magnetic moment of each atom in the cell is affected by resonant oscillations at frequencies that are multiples of those of the radio frequency excitation field. The result is then a modulation of transmitted light, particularly at angular frequencies $\xi$, $\Omega$ and $\omega$. The amplitude of oscillations at one of these angular frequencies can thus be used to measure the modulus of the magnetic field colinear with the corresponding component of the RF field.

Figure 2:
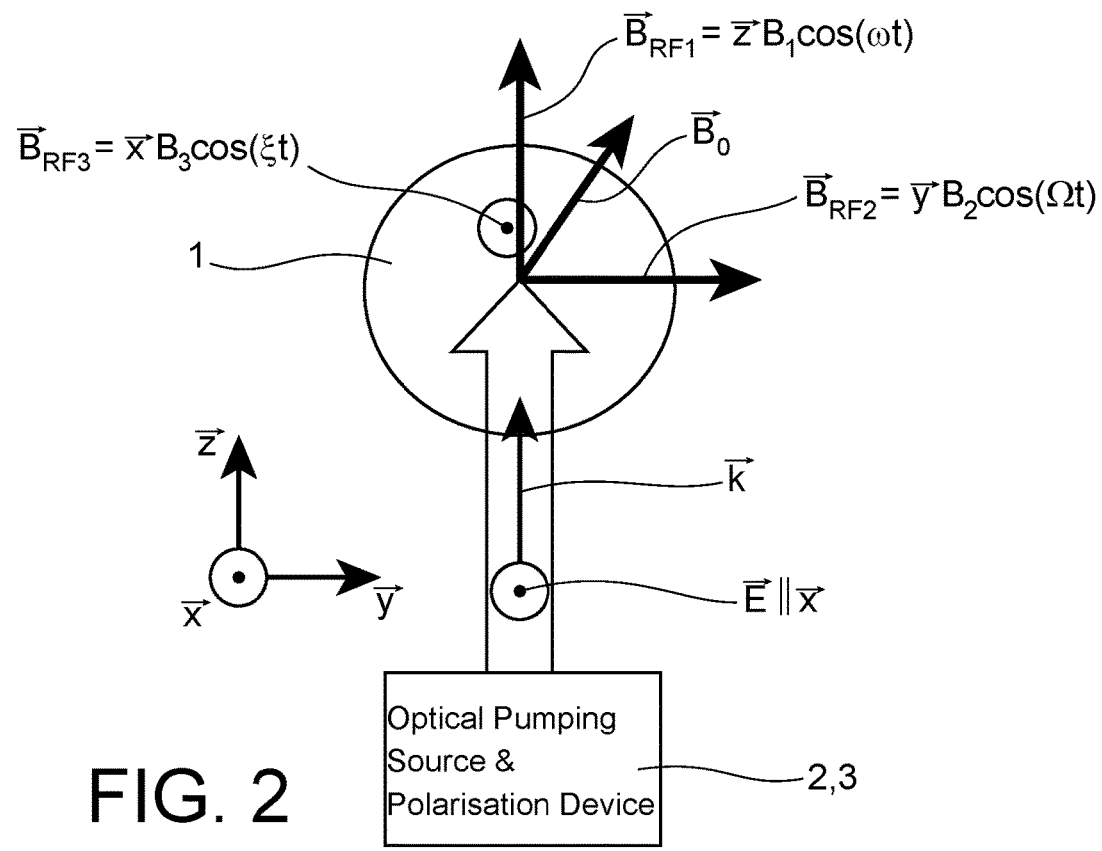
FIG. 2 is a diagram of an example arrangement of the radio frequency fields relative to the optical pumping components.

FIG. 2 shows an example layout of components of the radio frequency field relative to the pumping components.

On this figure, $\vec{k}$ designates the propagation vector of the pump beam oriented along the $\vec{z}$ direction and $\vec{E}$ designates the electric field oriented along the $\vec{x}$ direction, corresponding to the linear direction of elliptical polarisation. The coils 7 make it possible to generate a component of the radio frequency excitation field, for each axis of the magnetometer, namely a component $\vec{B}_{RF1}$ oriented along the $\vec{z}$ axis, a component $\vec{B}_{RF2}$ oriented along the $\vec{y}$ axis and a component $\vec{B}_{RF3}$ oriented along the $\vec{x}$ axis, with angular frequency of $\omega$, $\Omega$ and $\xi$ respectively.

In one example embodiment, the component $\vec{B}_{RF2}$ orthogonal to the two preferred pumping directions has the highest frequency, for example 50 kHz. The other two components of the radio frequency field have significantly lower frequencies, although much higher than the atom relaxation rate, and in a non-integer relation to each other and relative to the frequency of component $\vec{B}_{RF2}$. For example, for helium for which the relaxation rate of the atoms is of the order of 1 kHz, the frequencies of components $\vec{B}_{RF1}$ and $\vec{B}_{RF3}$ can be fixed at 7 kHz and 9 kHz respectively.

Components $\vec{B}_{RF2}$ and $\vec{B}_{RF3}$ are strictly orthogonal to the direction of the orientation. Therefore the atomic orientation varies as a function of these components, while component $\vec{B}_{RF1}$ that is parallel to the pumping direction only has a second order effect on the variation of this orientation. Therefore the variation of the atomic orientation is reduced essentially to the variation that would have occurred in the absence of $\vec{B}_{RF1}$. Thus, the orientation has components at frequencies (and their harmonics and interharmonics) of components $\vec{B}_{RF2}$ and $\vec{B}_{RF3}$ with angular frequencies of $\Omega$ and $\xi$ respectively. The amplitude of a photo-detection signal demodulated at one of these frequencies is proportional to the component of the ambient magnetic field parallel to the corresponding component of the radio frequency field. In particular, it is thus possible to determine the components By and Bx of the ambient field. And the first inter-harmonic at $\Omega \pm \xi$ can be used to find the component Bz of the ambient field, however with a significantly higher noise level. But this noise level is compensated by the measurement of Bz described below making use of the alignment conferred on the atoms.

Components $\vec{B}_{RF1}$ and $\vec{B}_{RF2}$ are orthogonal to the direction of the electric field E. Therefore the variation of the atomic alignment is controlled principally by these two components, while the component $\vec{B}_{RF3}$ parallel to this alignment has a low impact on it. Nevertheless, this impact is slightly greater than that of component $\vec{B}_{RF1}$ on the orientation due to a longitudinal alignment residue originating from the alignment induced by circular polarisation (while there are no components oriented by any residue induced by linear polarisation). Nevertheless, the alignment is quite similar to the alignment that would occur in the absence of $\vec{B}_{RF3}$, in a manner similar to that observed in optical pumping magnetometers pumped in alignment as described for example in S. Morales et al., "Magnetocardiography measurements with $^4$He vector optically pumped magnetometers at room temperature," Phys. Med. Biol., 2017. Thus, the alignment has components at frequencies (and their harmonics and inter-harmonics) of components $\vec{B}_{RF1}$ and $\vec{B}_{RF2}$ with angular frequencies of $\omega$ and $\Omega$ respectively. The amplitude of a photo-detection signal at one of these frequencies is proportional to the component of the ambient magnetic field parallel to the corresponding component of the RF field. In particular, it is possible to determine the components By and Bx of the ambient field. And the first inter-harmonic at $\omega \pm \Omega$ can be used to find the component Bx of the ambient field, however with a noise level significantly worse than for the other two components. But this noise level is compensated by the measurement of Bx described above making use of the orientation conferred on the atoms.

The parametric resonance detection device 6 is thus configured to monitor the variation of atomic alignments and orientations and to obtain amplitudes of the three components of the ambient magnetic field by synchronous demodulation at the three frequencies of the components of the radio frequency field. The detection device 6 comprises an optical arrangement for this purpose configured to temporally or spatially separate an optical signal carrying information about an alignment state of the atoms of the atomic gas from an optical signal carrying information about an orientation state respectively of the atoms of the atomic gas.

In particular, the detection device can be configured to measure the amplitude of the optical signal carrying information about the state of orientation of the atoms of the atomic gas at a harmonic of each of the components of the radio frequency excitation field orthogonal to the direction of propagation $\vec{k}$ of the laser beam, namely the $\vec{B}_{RF2}$ and $\vec{B}_{RF3}$ components, this amplitude being proportional to the By and Bx components respectively of the ambient field The detection device is also configured to measure the amplitude of the optical signal carrying information about the alignment state of the atoms of the atomic gas at a harmonic of each of the components of the radio frequency excitation field orthogonal to the direction of the electric field $\vec{E}$, namely the $\vec{B}_{RF1}$ and $\vec{B}_{RF2}$ components, this amplitude being proportional to the Bz and By components respectively of the ambient field As described in the following, the analysis of the optical signal carrying information about an alignment state, respectively an orientation state, of the atoms of the atomic gas can be an analysis on the absorption of the linear, respectively circular, component when crossing through the cell, or it can be an analysis on the relative proportion of right and left circular polarisations, respectively horizontal and vertical linear polarisations, in the beam that has passed through the cell.

Figure 3:
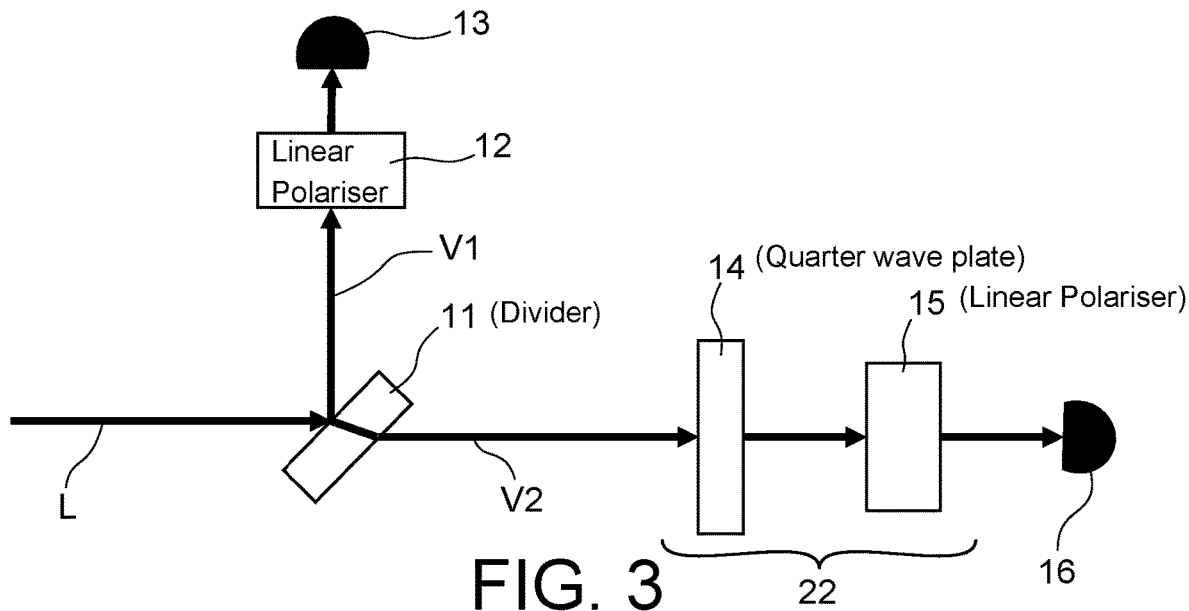
FIGS. 3, 4 and 5 are diagrams of optical arrangements that can be used in the parametric resonance detection device of the magnetometer according to the invention.
Figure 4:
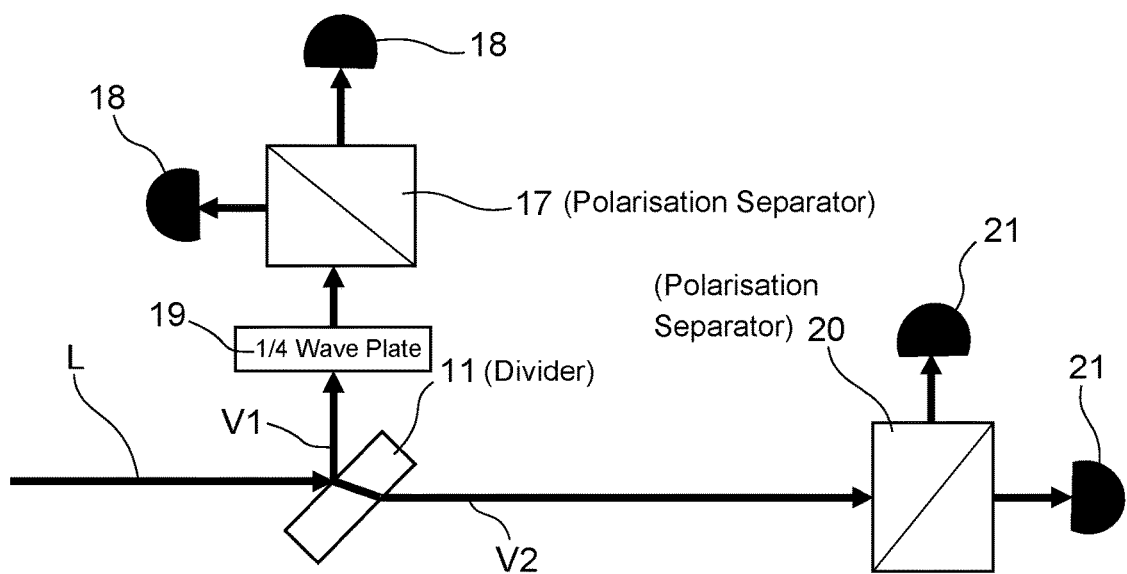

In the first embodiment illustrated on FIGS. 3 and 4, the optical arrangement comprises a divider 11 of the probe beam that passed through the cell into a first channel V1 and a second channel V2, an alignment state analyser on the first channel and an orientation state analyser on the second channel. It is impossible to position such analysers in series, since all information about circular/linear polarisation is lost at the output from such an analyser. Therefore a spatial separation of light is made into two parts using the divider 11, these two parts having an equal or similar energy which in particular makes it possible to measure alignment and orientation concomitantly. According to one particular embodiment, the divider 11 is a non-polarising separating plate that separates the power of the beam L on the two channels V1, V2, each having 50% of the incident power of the light beam L.

When the light beam used for pumping is also used as a probe beam for detection, information about alignment and orientation is contained in the absorption of the linear and circular components respectively. As shown on FIG. 3, the alignment state analyser on one of the channels comprises a linear polariser 12 and a photodetector 13 that outputs a photo-detection signal carrying information about the state of alignment of atoms, and the orientation state analyser on the other of the channels comprises a circular polariser 22 (a quarter wave plate 14 associated with a linear polariser 15) and a photodetector 16 that outputs a photodetection signal carrying information about the orientation state of atoms.

It is advantageous to use a probe beam distinct from the pump beam, to improve sensitivity. In such a case, it is useful to offset the frequency of probe light relative to the atomic transition frequency used so as not to induce residual pumping with the probe beam. The result of this offset is that a measurement in absorption is not very efficient. Therefore it is preferable to make a measurement in birefringence consisting of measuring the relative proportion of the left and right circular polarisations or of the horizontal and vertical linear polarisations.

To achieve this, as shown on FIG. 4, the alignment state analyser on the first channel V1 comprises a quarter wave plate 19, a polarisation separator 17 capable of separating the right circular polarisation and the left circular polarisation of the laser beam on a first and a second path, and a photodetector 18 on each of the first and second paths to be able to measure the ratio of light intensity between the two circular polarisations and thus output a photodetection signal carrying information about the alignment of atoms. And the orientation state analyser on the second channel V2 comprises a polarisation separator 20 capable of separating horizontal linear polarisation and vertical linear polarisation of the laser beam on a first and a second path, and a photodetector 21 on each of the first and second paths to be able to measure the ratio of the light intensity between the two linear polarisations and thus output a photodetection signal carrying information about the orientation of atoms.

In a second embodiment that can be used regardless of whether or not the probe beam is distinct from the pump beam (when the probe beam is identical to the pump beam, polarisation is of the linear polarisation—circular polarisation alternation type), a temporal separation is made of optical signals carrying alignment and orientation information on the same channel. This temporal separation is made at a faster frequency than the relaxation time of atoms and is non-commensurable to the frequencies of components of the RF field, for example at a frequency of 1 MHz.

Figure 5:
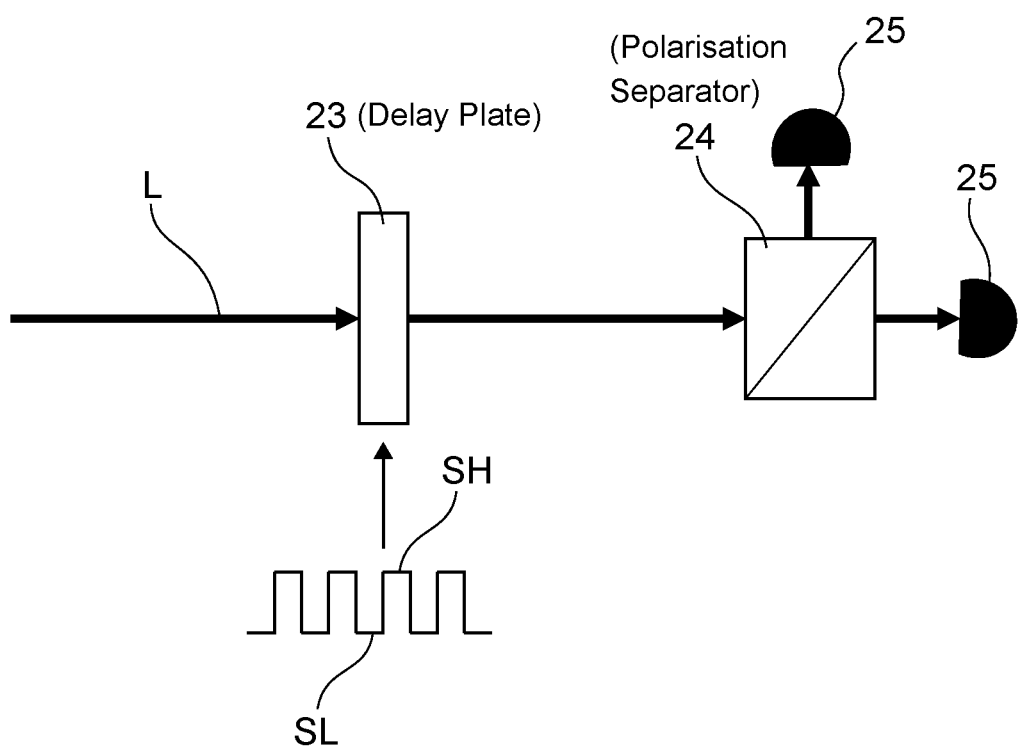

As shown on FIG. 5, the optical set up can include an electrically controllable delay plate 23 for this purpose. This plate can be modulated with a square wave such that during half-periods in which its output level is high (denoted SH), it behaves like a quarter wave plate, while during low level half periods (denoted SL), it behaves like a plate with no delay or a half-wave plate. After this plate, the optical arrangement comprises an atomic state analyser making an absorption measurement or a birefringence measurement with a polarisation separator 24 and two photodetectors 24. Considering the example of a birefringence measurement, during the SL Phases, the output from the atomic state analyser is proportional to the difference between the two linear polarisations, which corresponds to a rotation of the polarisation plane of the probe and makes it possible to measure the orientation along its propagation axis using a measurement scheme known in the field as the "Faraday scheme", as explained for example in the paper by F. Laloë, M. Leduc, and P. Minguzzi, "Relations entre l'état angulaire d'une vapeur atomique soumise au pompage optique et ses propriétés d'absorption et de dispersion," (Relations between the angular state of an optically pumped atomic vapour and its absorption and dispersion properties) Journal de Physique, vol. 30, No. 2-3, pp. 277-288, 1969. During the SH phases, the output from the atomic state analyser is proportional to the difference in intensity between the two circular polarisations, so that information can be obtained on the atomic alignment transverse to the propagation direction of the probe beam, according to what is reported in the same paper.

The invention is not limited to the vector magnetometer described above, and also relates to a method of measuring a magnetic field using such a magnetometer, and particularly a method including steps consisting of linearly and circularly polarising the light beam emitted towards the cell, and using an optical arrangement in the detection device to separate optical signals carrying information about an alignment state and information about an orientation state respectively, of atoms of the atomic gas.

What is claimed is:
1. An optically pumped vector magnetometer, comprising:
a cell filled with atoms of an atomic gas subjected to an ambient magnetic field,
an optical pumping source arranged to emit a pump beam having a pumping wavelength towards the cell,
a parametric resonance detection device arranged to receive a probe beam that has passed through the cell, the probe beam being the pump beam or a beam distinct from the pump beam, and
a polarisation device configured to confer a linear polarisation and a circular polarisation to the pump beam emitted towards the cell and thus to place the atoms of the atomic gas in a state which is both aligned and oriented,
wherein the parametric resonance detection device comprises an optical arrangement configured to separate, from the probe beam that has passed through the cell, an optical signal carrying information about an alignment state of the atoms of the atomic gas and an optical signal carrying information about an orientation state of the atoms of the atomic gas.

2. The optically pumped vector magnetometer according to claim 1, further comprising a parametric resonance excitation source configured to induce in the cell a radio frequency excitation field having three components each oscillating at its own oscillation frequency, and
wherein the parametric resonance detection device is configured to make a synchronous detection at a harmonic of each oscillation frequency.

3. The optically pumped vector magnetometer according to claim 2, wherein the parametric resonance detection device is configured to measure the amplitude of the optical signal carrying information about the orientation state of the atoms of the atomic gas at a harmonic of the oscillation frequency of each of the components of the radio frequency excitation field orthogonal to a propagation direction of the pump beam, and to measure the amplitude of the optical signal carrying information about the alignment state of the atoms of the atomic gas at a harmonic of the oscillation frequency of each of the components of the radio frequency excitation field orthogonal to a direction of an electric field of the pump beam.

4. The optically pumped vector magnetometer according to claim 1, wherein the optical arrangement comprises:
   a divider of the probe beam that passed through the cell into a first channel and a second channel,
   an alignment state analyser on the first channel, and
   an orientation state analyser on the second channel.

5. The optically pumped vector magnetometer according to claim 4, wherein the alignment state analyser comprises a linear polariser and a photodetector.

6. The optically pumped vector magnetometer according to claim 4, wherein the circular orientation state analyser comprises a circular polariser and a photodetector.

7. The optically pumped vector magnetometer according to claim 4, wherein the alignment state analyser comprises a quarter wave plate, a polarisation separator that can separate a right circular polarisation and a left circular polarisation of the probe beam on a first and a second path, and a photodetector on each of the first and second paths.

8. The optically pumped vector magnetometer according to claim 4, wherein the orientation state analyser comprises a polarisation separator that can separate a horizontal linear polarisation and a vertical linear polarisation of the probe beam on a first and a second path, and a photodetector on each of the first and second paths.

9. The optically pumped vector magnetometer according to claim 1, wherein the optical arrangement comprises:
   a temporal separator of the probe beam that passed through the cell alternately into a circularly polarised beam, and
   a linearly polarised beam, and an atomic state analyser downstream from the separator.

10. The optically pumped vector magnetometer according to claim 1, wherein the polarisation device is configured so as to simultaneously confer the linear polarisation and the circular polarisation to the pump beam.

11. The optically pumped vector magnetometer according to claim 1, wherein the polarisation device is configured so as to alternately confer the linear polarisation and then the circular polarisation to the pump beam.

12. A method of measuring a magnetic field using an optically pumped vector magnetometer which comprises a cell filled with atoms of an atomic gas subjected to an ambient magnetic field, an optical pumping source capable of emitting a pump beam tuned to a pumping wavelength towards the cell, a parametric resonance detection device receiving a probe beam that has passed through the cell, the probe beam being the pump beam or a beam distinct from the pump beam, and a closed loop slaving system of the magnetometer to make it operate in zero field, wherein the method includes the steps comprising:
   linearly and circularly polarising the pump beam emitted towards the cell so as to place the atoms of the atomic gas in a state which is both aligned and oriented, and
   using an optical arrangement in the parametric resonance detection device to separate, from the probe beam that passed through the cell, an optical signal carrying information about an alignment state of the atoms and an optical signal carrying information about an orientation state of the atoms.

* * * * *